(12) United States Patent
Chang et al.

(10) Patent No.: US 7,986,814 B2
(45) Date of Patent: Jul. 26, 2011

(54) METHOD FOR MEASURING A CURVED SURFACE OF AN OBJECT

(75) Inventors: Chih-Kuang Chang, Taipei Hsien (TW); Xin-Yuan Wu, Shenzhen (CN); Min Wang, Shenzhen (CN); Hua Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 28 days.

(21) Appl. No.: 12/567,872

(22) Filed: Sep. 28, 2009

(65) Prior Publication Data

US 2010/0150402 A1   Jun. 17, 2010

(30) Foreign Application Priority Data

Dec. 17, 2008   (CN) .......................... 2008 1 0306324

(51) Int. Cl.
*G06K 9/00* (2006.01)

(52) U.S. Cl. ......... 382/106; 382/162; 382/164; 382/254

(58) Field of Classification Search .................. 382/106, 382/162, 164, 254
See application file for complete search history.

(56) References Cited

U.S. PATENT DOCUMENTS

| | | | |
|---|---|---|---|
| 6,377,702 B1* | 4/2002 | Cooper | 382/167 |
| 6,560,356 B1* | 5/2003 | Takahashi et al. | 382/162 |
| 7,116,338 B2* | 10/2006 | Fukao et al. | 345/593 |
| 7,623,138 B2* | 11/2009 | Fukao et al. | 345/597 |
| 2003/0099393 A1* | 5/2003 | Oshiumi et al. | 382/150 |

* cited by examiner

*Primary Examiner* — Bhavesh M Mehta
*Assistant Examiner* — Stephen R Koziol
(74) *Attorney, Agent, or Firm* — Raymond J. Chew (57) ABSTRACT

A method for measuring a curved surface of an object is provided. The method aligns a point-cloud of an object and a triangulated curved surface of the object, obtain an original deviation value for each triangle on the triangulated curved surface by measuring a distance between each triangle and the nearest point in the point-cloud, and assign a color to each triangle according to a color assigned to a deviation range in which each original deviation value falls. The method further balances the assigned colors of all triangles on the triangulated curved surface, and generates a report according to data on the triangulated curved surface with the balanced colors.

20 Claims, 6 Drawing Sheets

METHOD FOR MEASURING A CURVED SURFACE OF AN OBJECT

BACKGROUND

1. Technical Field

Embodiments of the present disclosure relates to computer aided design (CAD) methods, and more particularly to a method for measuring a curved surface of an object.

2. Description of Related Art

A three-dimensional (3D) measurement machine is widely used to measure a shape of a 3D object. Such 3D measurement machine measures a set of spatial coordinates of points on the 3D object by contacting a probe on the surface of the 3D object, and capturing the surface based on the coordinates. The captured surface and a standard surface defined by a CAD model of the 3D object are compared, so as to determine a precision of the CAD model of the 3D object.

Usually, a 3D scanner is adapted to capture geometric information of the 3D object by gathering high resolution points representing the shape of the 3D object. Moreover, standard curved surfaces of the 3D object can be represented by dense triangular (or other shaped) meshes, which can cumulatively form outlines of the 3D object.

In one such CAD method, it is difficult to measure a surface of the 3D object via the 3D measurement machine if the shape of the 3D object is complicated, since the surface of the 3D object may be highly curved. More importantly, if multiple 3D objects need to be measured, inefficiency results, which wastes time and reduces productivity.

Therefore, there is a need for a method to overcome the aforementioned problem.

DETAILED DESCRIPTION

All of the processes described may be embodied in, and fully automated via, functional code modules executed by one or more general purpose computers or processors. The code modules may be stored in any type of computer-readable medium or other storage device. Some or all of the methods may alternatively be embodied in specialized computer hardware or electronic apparatus.

Figure 1:
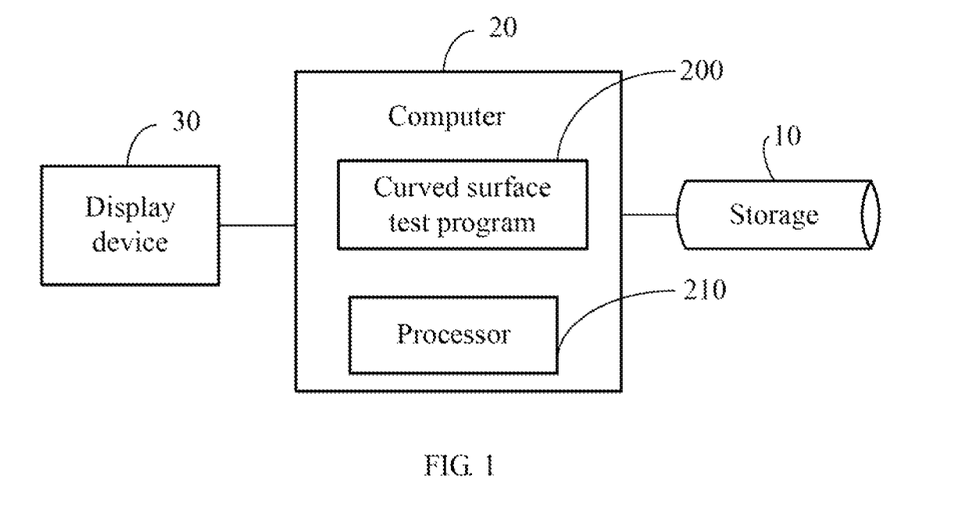
FIG. 1 is a block diagram of one embodiment of a method for measuring a curved surface of an object.

FIG. 1 is a block diagram of one embodiment of a computer 20 in communication with a storage 10 and a display device 30. The computer 20 includes a curved surface test program 200, computerized codes of the curved surface test program 200 are stored in the storage 10, a processor 210 executes the computerized codes, to measure curved surfaces of objects.

The storage 10 further stores data regarding a curved surface of an object. It may be understood that the object is a computer aided design (CAD) model. In one embodiment, the curved surface may be represented by a set of dense triangles (hereinafter, referred to as "the triangulated curved surface"). Such data on the triangulated curved surface may include vertex coordinates of each triangle on the curved surface, vector correlations of the three vertices of each triangle, and normal vectors of each triangle. The storage 10 also stores data regarding a point-cloud of the object scanned by a 3D scanner (not shown in FIG. 1). The stored data, in one embodiment, may comprise coordinates of each point in the point-cloud.

The display device 30 displays the triangulated curved surface, the point-cloud, and reports the measurement results.

In one embodiment, the curved surface test program 200 receives and aligns the triangulated curved surface and the point-cloud. Furthermore, the curved surface test program 200 determines an original deviation value for each triangle on the triangulated curved surface by measuring a distance, if any, between each triangle and the nearest point in the point-cloud. Moreover, the curved surface test program 200 assigns an original color and corresponding color value to each triangle according to the color assigned to the deviation range in which each original deviation value falls. It is noted that, during scanning the object, certain points on the object may be omitted, and certain points obtained may have deformation errors. Therefore, the curved surface test program 200 further balances the assigned colors of the triangles, so as to reduce errors on the point-cloud. Additionally, the curved surface test program 200 generates a report on measurement results.

Figure 2:
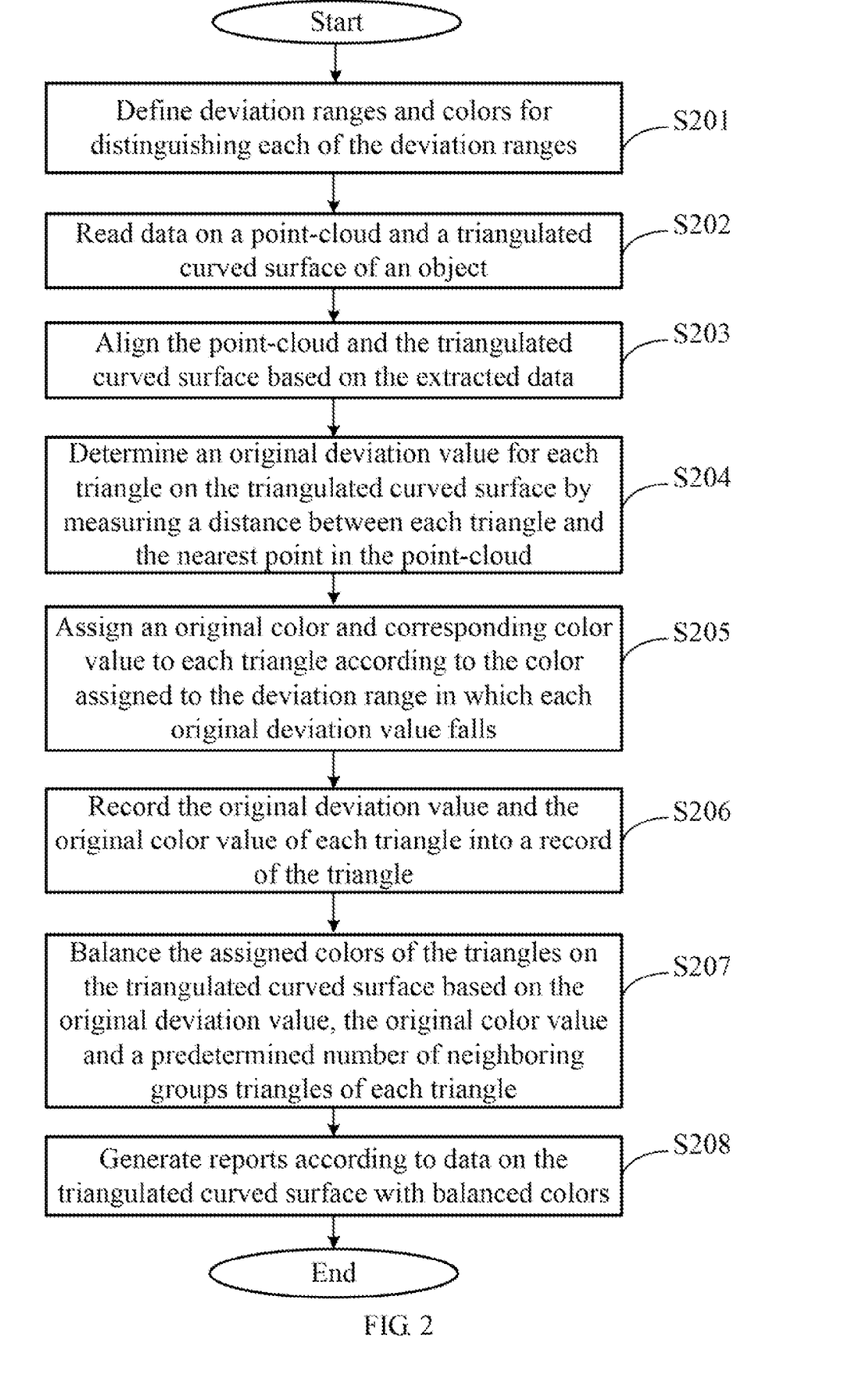
FIG. 2 is an overall flowchart of one embodiment of a method for measuring a curved surface of an object.

FIG. 2 is a flowchart of one embodiment of a method for measuring a curved surface of an object. Depending on the embodiment, additional blocks may be added, others removed, and the ordering of the blocks may be changed.

In block S201, one or more deviation ranges and colors for distinguishing the deviation ranges may be assigned via an interface provided by the curved surface test program 200. For example, deviation ranges may be defined as 0.02 mil intervals that start with a minimal boundary value of a lowest range being −0.14 mil and a maximal boundary value of a highest range being +0.14 mil. It is noted that, in this embodiment, deviation values between the minimal boundary value and the maximal boundary value are regarded as allowable errors. Each deviation range represents an area of the triangulated curved surface having deviations in a predetermined range. For example, all triangles on the triangulated curved surface having a magnitude of deviation greater than or equal to −0.14 mil but less than −0.12 mil may fall within a deviation range [−0.14, −0.12], and all triangles on the triangulated curved surface having a magnitude of deviation greater than or equal to +0.12 mil but less than +0.14 mil may fall within a deviation range [+0.12, +0.14]. Each deviation range has a unique color for distinguishing the deviation range from any other deviation ranges. For example, a color of the deviation range [−0.14, −0.12] may be defined as blue-black, and a color of the deviation range [+0.12, +0.14] may be defined as bright-yellow.

In block S202, the curved surface test program 200 determines vertex and coordinate data (hereinafter, "reads data") on the triangulated curved surface and one or more point-clouds of the object from the storage 10, such as vertex coordinates, vector correlations of three vertices of each triangle, normal vectors of each triangle, and coordinates of each point in the point-cloud.

In block S203, the curved surface test program 200 aligns the one or more point-clouds and the triangulated curved surface based on the data on the triangulated curved surface and the one or more point-clouds.

In block S204, the curved surface test program 200 determines an original deviation value for each triangle on the triangulated curved surface by measuring a separation, if any, between each triangle and the nearest point in the point-cloud.

In block S205, the curved surface test program 200 assigns an original color and corresponding color value to each triangle according to the color assigned to the deviation range in which each original deviation value falls.

In block S206, the curved surface test program 200 records the original deviation value and the original color value of each triangle into a record of the triangle. It is noted that the record of the triangle further stores a balanced deviation value, a balanced color value and normal vectors of the triangle, vertex coordinates, and vector correlations of three vertices of the triangle.

Figure 3:
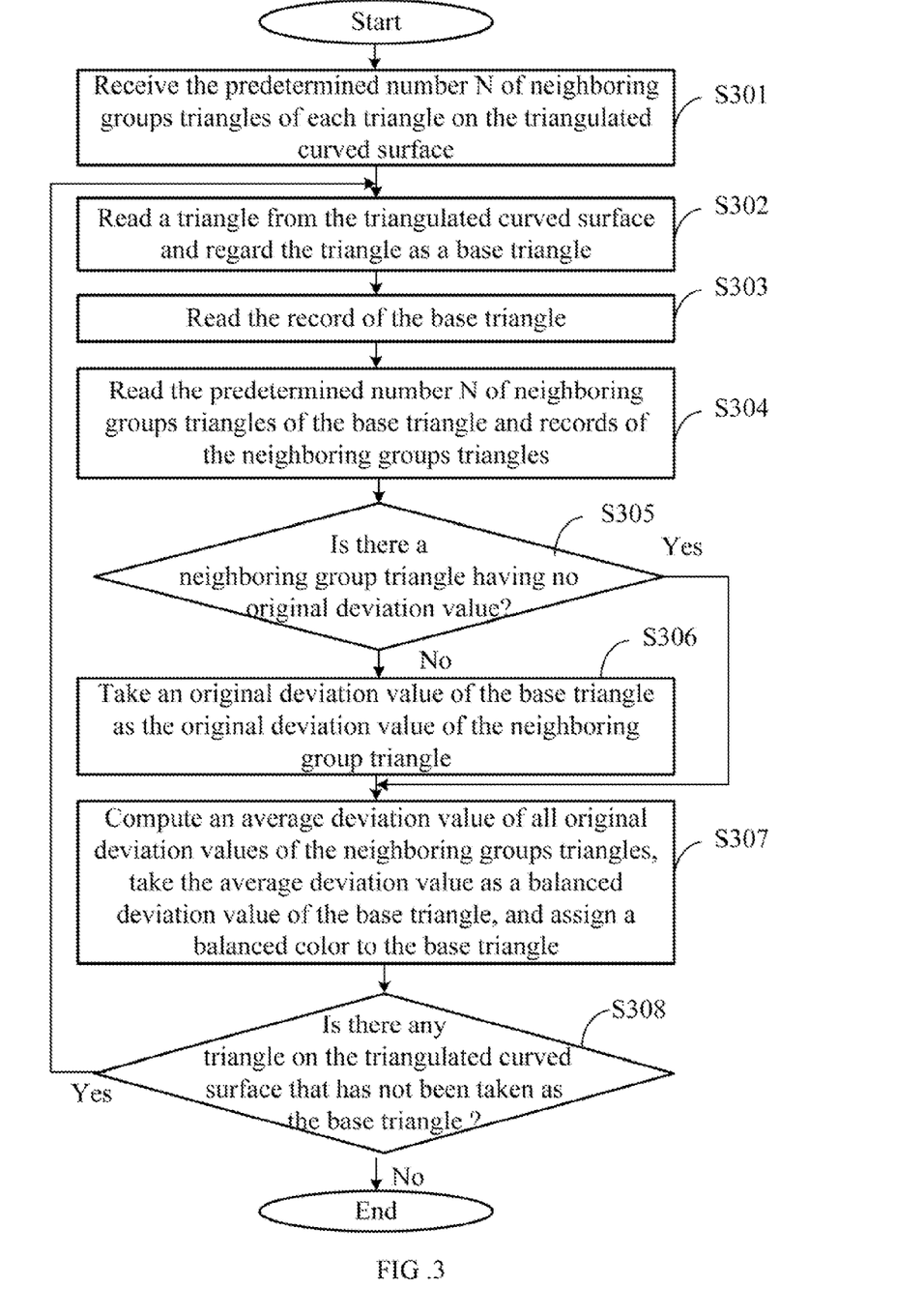
FIG. 3 is a detailed description of one block in FIG. 2 for balancing assigned colors of all triangles on a triangulated curved surface.

In block S207, the curved surface test program 200 balances the assigned color of each triangle on the triangulated curved surface according to the original deviation value, the original color value of the triangle, and a predetermined number N of neighboring groups triangles of each triangle (detailed description is given in FIG. 3). The predetermined number N of neighboring groups triangles refers to N groups of triangles around a triangle. For example, if given a triangle A, then an average value of original deviation values of all triangles in the N groups is taken as a balanced deviation value of the triangle A. When N=1, a first group of triangles is referred to, when N=2, a first group and a second group of triangles are referred to, and so on. A first group is defined as all triangles of the triangulated curved surface having a common vertex with the given triangle A. A second group is defined as only those triangles having a common vertex with any of the triangles in the first group, and so on.

Figure 5:
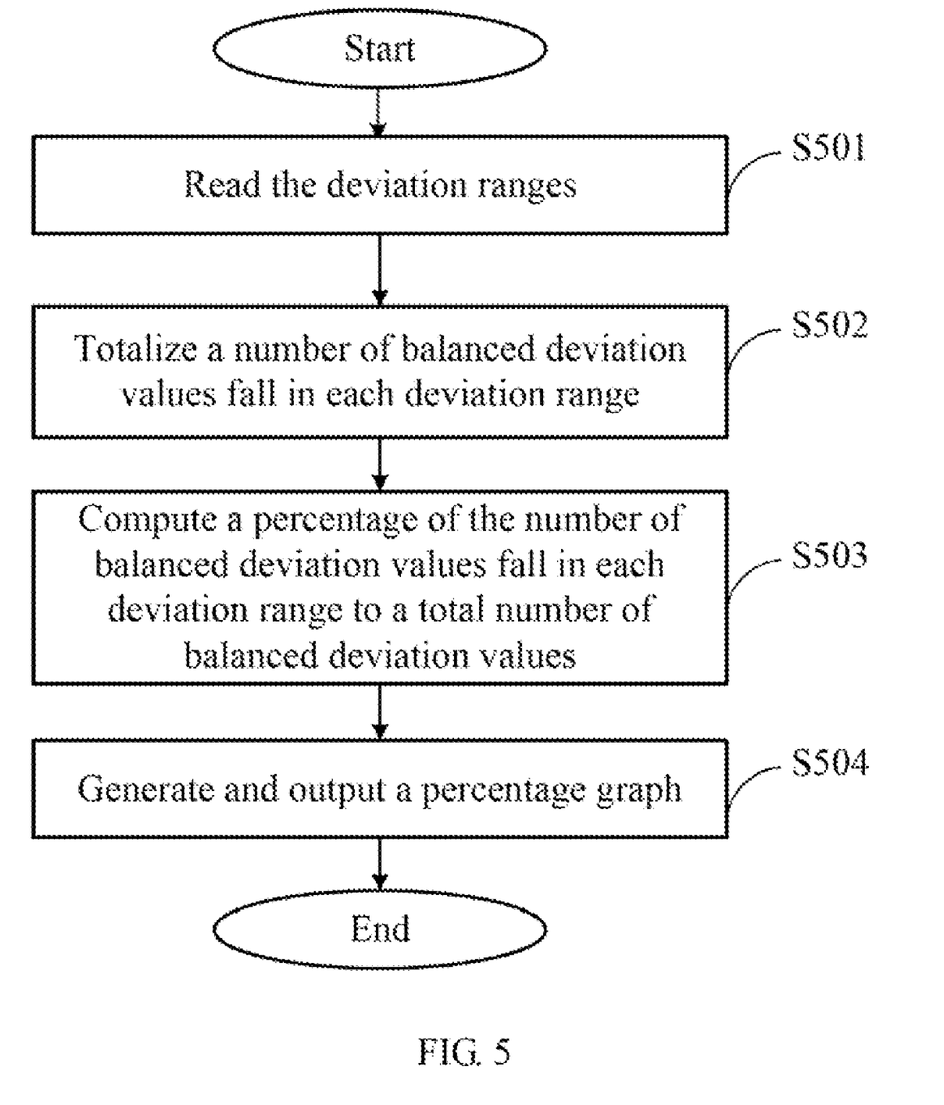
FIG. 5 is a detailed description of the another block in FIG. 2 of another embodiment.

In block S208, the curved surface test program 200 generates a report according to the data on the triangulated curved surface with the balanced colors (detailed description is given in FIG. 5).

FIG. 3 is a detailed description of block S207 in FIG. 2. Depending on the embodiment, additional blocks may be added, others removed, and the ordering of the blocks may be changed.

In block S301, the curved surface test program 200 receives the predetermined number N of neighboring groups triangles of each triangle, such as N=1.

In block S302, the curved surface test program 200 reads a triangle from the triangulated curved surface and regards the triangle as a base triangle.

In block S303, the curved surface test program 200 reads the record of the base triangle that includes a balanced deviation value, a balanced color value and normal vectors of the base triangle, vertex coordinates, and vector correlations of the three vertices of the base triangle.

In block S304, the curved surface test program 200 reads the predetermined number N of neighboring groups triangles of the base triangle and records of the neighboring groups triangles, i.e. N=1, the triangles in the first group of triangles around the base triangle and the records of the first group of triangles are read.

In block S305, the curved surface test program 200 determines if there is a neighboring group triangle having no original deviation value based on information recorded in the records of the neighboring triangles. If there is a neighboring group triangle that has no original deviation value, in block S306, the curved surface test program 200 takes an original deviation value of the base triangle as the original deviation value of the neighboring group triangle, then the procedure goes to block S307.

Otherwise, in block S305, if the curved surface test program 200 determines that each neighboring group triangle has an original deviation value, the procedure directly goes to block S307 as described below. In block S307, the curved surface test program 200 determines an average deviation value of all original deviation values of the neighboring groups triangles, takes the average deviation value as a balanced deviation value of the base triangle, assign a balanced color to the base triangle according to the color assigned to the deviation range in which the balanced deviation value falls, and writes the balanced deviation value into the record of the base triangle.

In block S308, the curved surface test program 200 determines if there is any triangle on the triangulated curved surface that has not been taken as the base triangle. If there is any triangle on the triangulated curved surface that has not been taken as the base triangle, the procedure repeats from block S302 as described above.

Figure 4:
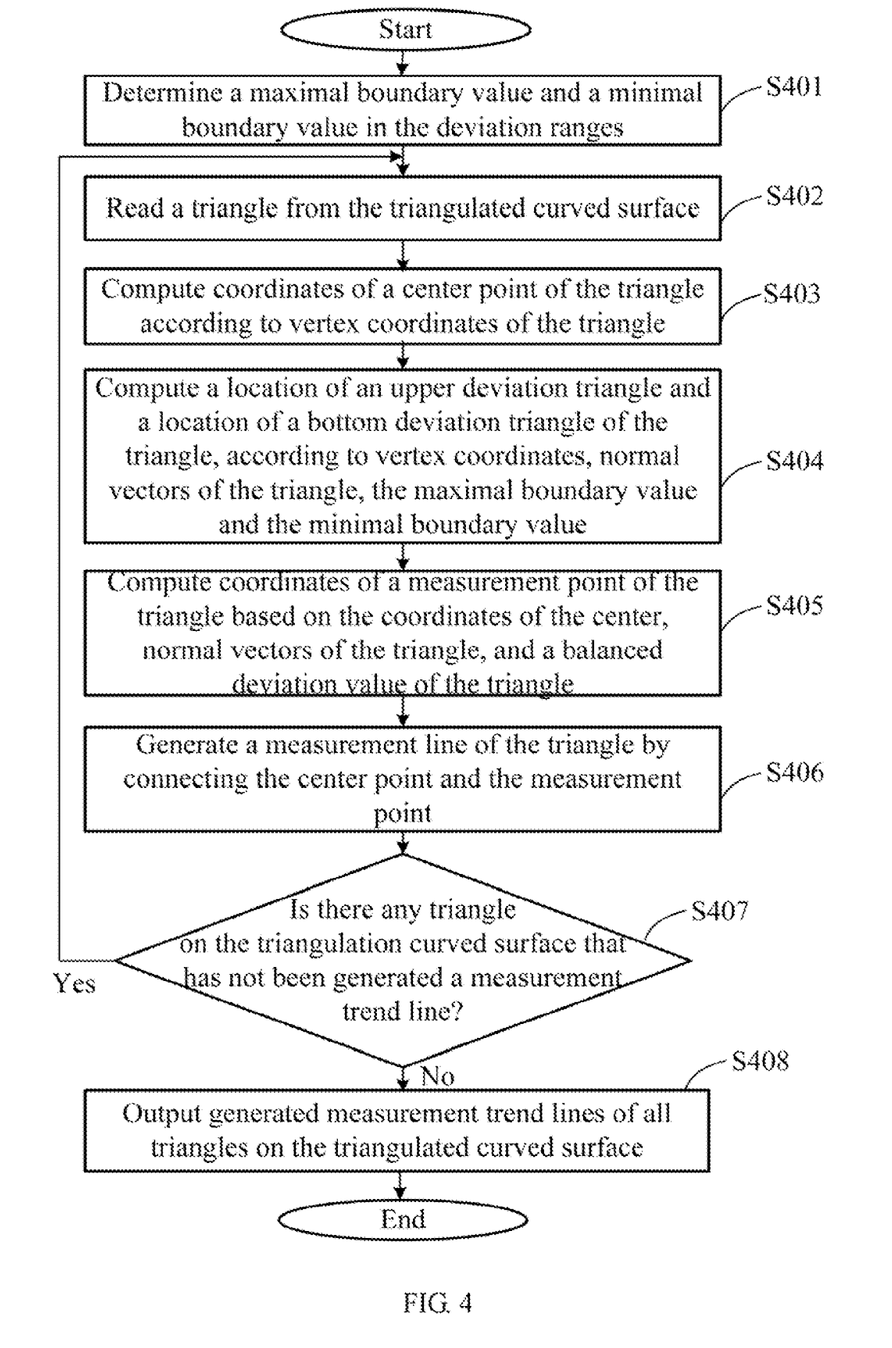
FIG. 4 is a detailed description of another block in FIG. 2 of one embodiment for generating reports based on data on the triangulated curved surface with balanced colors.

FIG. 4 is a detailed description of block S208 in FIG. 2 of one embodiment. Depending on the embodiment, additional blocks may be added, others removed, and the ordering of the blocks may be changed.

In block S401, the curved surface test program 200 reads a maximal boundary value and a minimal boundary value in the deviation ranges, as stated above, for example, the maximal boundary value may be +0.14 mil and the minimal boundary value may be −0.14 mil.

In block S402, the curved surface test program 200 reads a triangle from the triangulated curved surface.

In block S403, the curved surface test program 200 determines coordinates of a center point (Xa, Ya, Za) of the triangle based on vertex coordinates of the triangle.

In block S404, the curved surface test program 200 determines vertex coordinates of an upper deviation triangle and a bottom deviation triangle of the triangle, according to the vertex coordinates, normal vectors of the triangle, the maximal boundary value and the minimal boundary value.

In block S405, the curved surface test program 200 determines coordinates (Xb, Yb, Zb) of a measurement point, such as a point "B" of the triangle based on the coordinates of the center, the normal vectors of the triangle, and a balanced deviation value of the triangle. It is assumed that normal vectors of the triangle are normal[0], normal[1], and normal[2], the balanced deviation value of the triangle is "D", then coordinates Xb, Yb, Zb of the measurement point "B" can be computed according to the following formulas: Xb=normal[0]*D+Xa; Yb=normal[1]*D+Ya; and Zb=normal[2]*D+Za.

In block S406, the curved surface test program 200 generates a measurement line of the triangle by connecting the center point and the measurement point, such as connecting the (Xa, Ya, Za) and the (Xb, Yb, Zb).

In block S407, the curved surface test program 200 determines if there is any triangle on the triangulation curved surface that has not been generated a measurement line. If there is any triangle on the triangulation curved surface that has not been generated a measurement line, the procedure repeats from block S402 until all triangles on the triangulation curved surface have been generated measurement lines. Then, the procedure goes to block S408.

Figure 6:
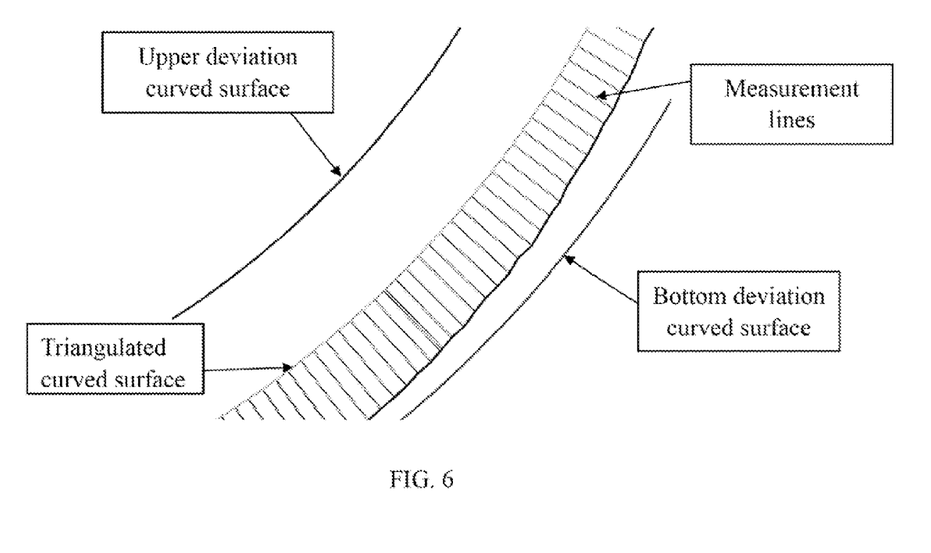
FIG. 6 illustrates measurement lines of the triangulated curved surface.

In block S408, the curved surface test program 200 outputs the generated measurement lines of all triangles on the triangulated curved surface via the display device 30. FIG. 6 illustrates the triangulated curved surface and the generated measurement lines of all triangles on the triangulated curved surface. As shown in FIG. 6, all upper deviation triangles compose an upper deviation curved surface of the triangulated curved surface, and all bottom deviation triangles compose a bottom deviation curved surface of the triangulated curved surface. In this embodiment, if any measurement line of a triangle juts out the upper deviation curved surface or the bottom deviation curved surface, the curved surface test program 200 ascertains that the triangle has a design error beyond an allowable error range.

FIG. 5 is a detailed description of block S208 in FIG. 2 of another embodiment. Depending on the embodiment, additional blocks may be added, others removed, and the ordering of the blocks may be changed.

In block S501, the curved surface test program 200 reads the deviation ranges.

In block S502, the curved surface test program 200 totalizes a number of balanced deviation values fall in each deviation range.

In block S503, the curved surface test program 200 determines a percentage of the number of balanced deviation values fall in each deviation range to a total number of balanced deviation values.

In block S504, the curved surface test program 200 outputs a percentage graph, i.e. a histogram or a pie chart, via the display device 30.

It should be emphasized that the above-described inventive embodiments are merely possible examples of implementations, and set forth for a clear understanding of the principles of the present disclosure. Many variations and modifications may be made to the above-described inventive embodiments without departing substantially from the spirit and principles of the present disclosure. All such modifications and variations are intended to be included herein within the scope of this disclosure and the above-described inventive embodiments, and the present disclosure is protected by the following claims.

What is claimed is:

1. A computer-implemented method for measuring a curved surface of an object, the method comprising:
   (a) defining a plurality of deviation ranges for the curved surface of the object and a unique color for each of the deviation ranges, wherein the curved surface of the object comprises a triangulated curved surface having a plurality of triangles;
   (b) reading data on the triangulated curved surface and one or more point-clouds of the object from a storage, wherein the data comprises vertex and vector information for each of the plurality of triangles on the triangulated curved surface;
   (c) aligning the one or more point-clouds and the triangulated curved surface based on the data;
   (d) determining an original deviation value for each triangle on the triangulated curved surface by measuring a distance between each triangle and a nearest point in the one or more point-clouds;
   (e) assigning an original color and a corresponding color value to each triangle according to the color assigned to the deviation range in which each original deviation value falls;
   (f) balancing the assigned colors of all triangles on the triangulated curved surface based on the original deviation value, the original color value, and a predetermined number of neighboring groups triangles of each triangle; and
   (g) generating a report according to data on the triangulated curved surface with the balanced colors and outputting the report on a display device.

2. The method as claimed in claim 1, further comprising a block of recording the original deviation value and the original color value of each triangle into a record of the triangle.

3. The method as claimed in claim 1, wherein the vertex and vector information comprises vertex coordinates, vector correlations of the vertices of each triangle, and normal vectors of each triangle on the triangulated curved surface.

4. The method as claimed in claim 1, wherein the data on the one or more point-clouds comprise coordinates of each point in the one or more point-clouds.

5. The method as claimed in claim 2, wherein block (f) comprises:
   (f1) receiving the predetermined number of neighboring groups triangles of each triangle on the triangulated curved surface;
   (f2) obtaining a triangle from the triangulated curved surface and regarding the triangle as a base triangle;
   (f3) reading the record of the base triangle;
   (f4) reading the predetermined number N of neighboring groups triangles of the base triangle and records of the neighboring groups triangles;
   (f5) determining a neighboring group triangle having no original deviation value according to information stored in the records of the neighboring group;
   (f6) taking an original deviation value stored in the record of the base triangle as the original deviation value of the neighboring group triangle having no original deviation value;
   (f7) determining an average deviation value of all original deviation values of the neighboring groups triangles, taking the average deviation value as a balanced deviation value of the base triangle, and assign a balanced color to the base triangle according to the color assigned to the deviation range in which the balanced deviation value falls;
   (f8) determining if there is any triangle on the triangulated curved surface that has not been taken as the base triangle; and
   (f9) repeating block (f2) to block (f8) upon the condition that there is any triangle on the triangulated curved surface that has not been taken as the base triangle.

6. The method as claimed in claim 5, wherein block (g) comprises:
   (g1) determining a maximal boundary value and a minimal boundary value from the deviation ranges;
   (g2) obtaining a triangle from the triangulated curved surface;
   (g3) determining coordinates of a center point of the triangle according to vertex coordinates of the triangle;
   (g4) determining a location of an upper deviation triangle and a location of a bottom deviation triangle of the triangle according to the vertex coordinates, normal vectors of the triangle, the maximal boundary value, and the minimal boundary value;
   (g5) determining coordinates of a measurement point of the triangle based on the coordinates of the center, normal vectors, and the balanced deviation value of the triangle;
   (g6) generating a measurement line of the triangle by connecting the center point and the measurement point;
   (g7) determining if there is any triangle on the triangulation curved surface that has not been generated a measurement line; and
   (g8) outputting generated measurement lines of all triangles on the triangulated curved surface, if all triangles on the triangulation curved surface have been generated measurement lines, otherwise, repeating block (g2) to block (g8).

7. The method as claimed in claim 6, wherein all upper deviation triangles compose an upper deviation curved surface of the triangulated curved surface, and all bottom deviation triangles compose a bottom deviation curved surface of the triangulated curved surface.

8. The method as claimed in claim 7, further comprising: determining a triangle in the triangulated curved surface has a design error beyond an allowable error range, if a measurement line of the triangle extends out of the upper deviation curved surface or the bottom deviation curved surface.

9. The method as claimed in claim 5, wherein block (g) comprises:
(k1) totalizing a number of balanced deviation values fall in each of the deviation ranges;
(k2) determining a percentage of the number of balanced deviation values fall in each of the deviation ranges to a total number of all balanced deviation values within the deviation ranges; and
(k3) generating and outputting a percentage graph according to the computed percentage.

10. A computer-implemented method for measuring a curved surface of an object, the method comprising:
defining a plurality of deviation ranges for the curved surface of the object and a unique color for each of the deviation ranges, wherein the curved surface of the object comprises a triangulated curved surface having a plurality of triangles;
selecting a plurality of triangles from the triangulated curved surface of the object;
reading data on one or more point-clouds and the curved surface from a storage, wherein the data comprises vertices and vector information for each of the plurality of triangles on the triangulated curved surface;
aligning the one or more point-clouds and the curved surface based on the data;
determining a deviation value of each triangle on the curved surface;
assigning a color and a corresponding color value of each triangle according to the color of a corresponding deviation range in which the deviation value falls;
balancing the assigned colors of all triangles on the curved surface based on the deviation values and the color values; and
generating a report according to data on the curved surface with the balanced colors and outputting the report on a display device.

11. The method as claimed in claim 10, wherein the block of determining a deviation value of each triangle is implemented by way of determining a distance between each triangle and the nearest point in the one or more point-clouds.

12. The method as claimed in claim 10, wherein the vertex and vector information comprise vertex coordinates, vector correlations of the vertices of each triangle, and normal vectors of each triangle on the curved surface.

13. The method as claimed in claim 10, wherein the data on the one or more point-clouds comprise coordinates of each point in the one or more point-clouds.

14. A non-transitory computer-readable medium having stored thereon instructions for measuring a curved surface of an object, the instructions performing blocks comprising:
(a) defining a plurality of deviation ranges for the curved surface of the object and a unique color for each of the deviation ranges, wherein the curved surface of the object comprises a triangulated curved surface having a plurality of triangles;
(b) reading data on the triangulated curved surface and one or more point-clouds of the object from a storage, wherein the data comprises vertices and vector information for each of the plurality of triangles on the triangulated curved surface;
(c) aligning the one or more point-clouds and the triangulated curved surface based on the data;
(d) determining an original deviation value for each triangle on the triangulated curved surface by measuring a distance between each triangle and the nearest point in the one or more point-clouds;
(e) assigning an original color and corresponding color value to each triangle according to the color assigned to the deviation range in which each original deviation value falls;
(f) balancing the assigned colors of all triangles on the triangulated curved surface based on the original deviation value, the original color value and a predetermined number of neighboring groups triangles of each triangle; and
(g) generating a report according to data on the triangulated curved surface with the balanced colors and outputting the report on a display device.

15. The non-transitory computer-readable medium as claimed in claim 14, wherein the instructions further performing a block of recording the original deviation value and the original color value of each triangle into a record of the triangle.

16. The non-transitory computer-readable medium as claimed in claim 15, wherein the block (f) comprises:
(f1) receiving the predetermined number of neighboring groups triangles of each triangle on the triangulated curved surface;
(f2) obtaining a triangle from the triangulated curved surface and regarding the triangle as a base triangle;
(f3) reading the record of the base triangle;
(f4) reading the predetermined number N of neighboring groups triangles of the base triangle and records of the neighboring groups triangles;
(f5) determining if there is a neighboring group triangle having no original deviation value according to information stored in the records of the neighboring group;
(f6) taking an original deviation value stored in the record of the base triangle as the original deviation value of the neighboring group triangle having no original deviation value;
(f7) determining an average deviation value of all original deviation values of the neighboring groups triangles, taking the average deviation value as a balanced deviation value of the base triangle, and assign a balanced color to the base triangle according to the color assigned to the deviation range in which the balanced deviation value falls;
(f8) determining if there is any triangle on the triangulated curved surface that has not been taken as the base triangle; and
(f9) repeating from the block (f2) to block (f8), if there is any triangle on the triangulated curved surface that has not been taken as the base triangle.

17. The non-transitory computer-readable medium as claimed in claim 16, wherein the block (g) comprises:
(g1) reading a maximal boundary value and a minimal boundary value from the deviation ranges;
(g2) obtaining a triangle from the triangulated curved surface;
(g3) determining coordinates of a center point of the triangle according to vertex coordinates of the triangle;
(g4) determining a location of an upper deviation triangle and a location of a bottom deviation triangle of the triangle according to the vertex coordinates, normal vectors of the triangle, the maximal boundary value, and the minimal boundary value;

(g5) determining coordinates of a measurement point of the triangle based on the coordinates of the center, normal vectors, and the balanced deviation value of the triangle;

(g6) generating a measurement line of the triangle by connecting the center point and the measurement point;

(g7) determining if there is any triangle on the triangulation curved surface that has not been generated a measurement line; and (g8) outputting generated measurement lines of all triangles on the triangulated curved surface, if all triangles on the triangulation curved surface have been generated measurement lines, otherwise, repeating from the block (g2) to block (g8).

18. The non-transitory computer-readable medium as claimed in claim 17, wherein all upper deviation triangles compose an upper deviation curved surface of the triangulated curved surface, and all bottom deviation triangles compose a bottom deviation curved surface of the triangulated curved surface.

19. The non-transitory computer-readable medium as claimed in claim 18, wherein the instructions further performing a block of determining a triangle in the triangulated curved surface has a design error beyond an allowable error range, if a measurement line of the triangle extends out of the upper deviation curved surface or the bottom deviation curved surface.

20. The non-transitory computer-readable medium as claimed in claim 16, wherein the block (g) comprises:

(k1) totalizing a number of balanced deviation values fall in each of the deviation ranges;

(k2) determining a percentage of the number of balanced deviation values fall in each of the deviation ranges to a total number of all balanced deviation values within the deviation ranges; and (k3) generating and outputting a percentage graph according to the computed percentage.

* * * * *